United States Patent
Park et al.

(10) Patent No.: US 10,996,261 B2
(45) Date of Patent: May 4, 2021

(54) SENSOR FOR GATE LEAKAGE DETECTION

(71) Applicant: QUALCOMM Incorporated, San Diego, CA (US)

(72) Inventors: Hyunwoo Park, San Diego, CA (US); Youn Sung Choi, San Diego, CA (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 205 days.

(21) Appl. No.: 16/186,623

(22) Filed: Nov. 12, 2018

(65) Prior Publication Data

US 2020/0049757 A1  Feb. 13, 2020

Related U.S. Application Data

(60) Provisional application No. 62/715,313, filed on Aug. 7, 2018.

(51) Int. Cl.
*G01R 31/26* (2020.01)

(52) U.S. Cl.
CPC ..... *G01R 31/2621* (2013.01); *G01R 31/2601* (2013.01)

(58) Field of Classification Search
CPC ............... G01R 31/52; G01R 31/2601; G01R 31/2621; G01R 31/2632; G01R 31/2855; G01R 31/2856; G01R 31/2858; G01R 31/884; G01R 31/3008
See application file for complete search history.

(56) References Cited

U.S. PATENT DOCUMENTS

| | | | |
|---|---|---|---|
| 6,157,691 A * | 12/2000 | Wei | H03K 3/0231 327/148 |
| 6,882,172 B1 | 4/2005 | Suzuki et al. | |
| 7,804,317 B1 * | 9/2010 | Parameshwaran | G01R 31/2884 324/762.02 |
| 8,354,671 B1 | 1/2013 | Im et al. | |
| 2004/0263192 A1 | 12/2004 | Persun et al. | |
| 2005/0212547 A1 | 9/2005 | Suzuki | |
| 2007/0025030 A1 | 2/2007 | Jung | |
| 2007/0146013 A1 | 6/2007 | Hsu et al. | |
| 2009/0210201 A1 | 8/2009 | Bickford et al. | |
| 2011/0260784 A1 * | 10/2011 | Eimitsu | H03K 17/162 327/543 |

(Continued)

OTHER PUBLICATIONS

Hou Y.T., et al., "Impact of Metal Gate Work Function on Gate Leakage of MOSFETs", Semiconductor Device Research Symposium, 2003 International Dec. 10-12, 2003, Piscataway, NJ, USA, IEEE, Dec. 10, 2003, XP010687187, DOI: 10.1109/ISDRS.2003. 1272039, ISBN: 978-0-7803-8139-1, pp. 154-155.

(Continued)

*Primary Examiner* — Thang X Le
(74) *Attorney, Agent, or Firm* — Withrow & Terranova, PLLC

(57) ABSTRACT

Aspects generally relate methods and apparatuses of gate leakage detection of a transistor. A gate pad is coupled to a gate of a MOS transistor. A gate leakage detection circuit is coupled to the gate pad, wherein the gate leakage detection circuit is configured to estimate a gate leakage current. Based on the estimated gate leakage current determining a quality of a gate fabrication process.

9 Claims, 5 Drawing Sheets

(56) References Cited

U.S. PATENT DOCUMENTS

| | | | |
|---|---|---|---|
| 2015/0067429 A1* | 3/2015 | Edwards | G01R 31/2818 |
| | | | 714/734 |
| 2015/0102850 A1* | 4/2015 | Eimitsu | H03K 19/00384 |
| | | | 327/382 |
| 2016/0112005 A1* | 4/2016 | Holzmann | H03K 3/0315 |
| | | | 331/108 C |
| 2017/0192049 A1* | 7/2017 | Tavernier | G01R 31/2884 |
| 2018/0212611 A1* | 7/2018 | Shen | H03L 7/0891 |

OTHER PUBLICATIONS

International Search Report and Written Opinion—PCT/US2019/040046—ISA/EPO—dated Oct. 30, 2019.

\* cited by examiner

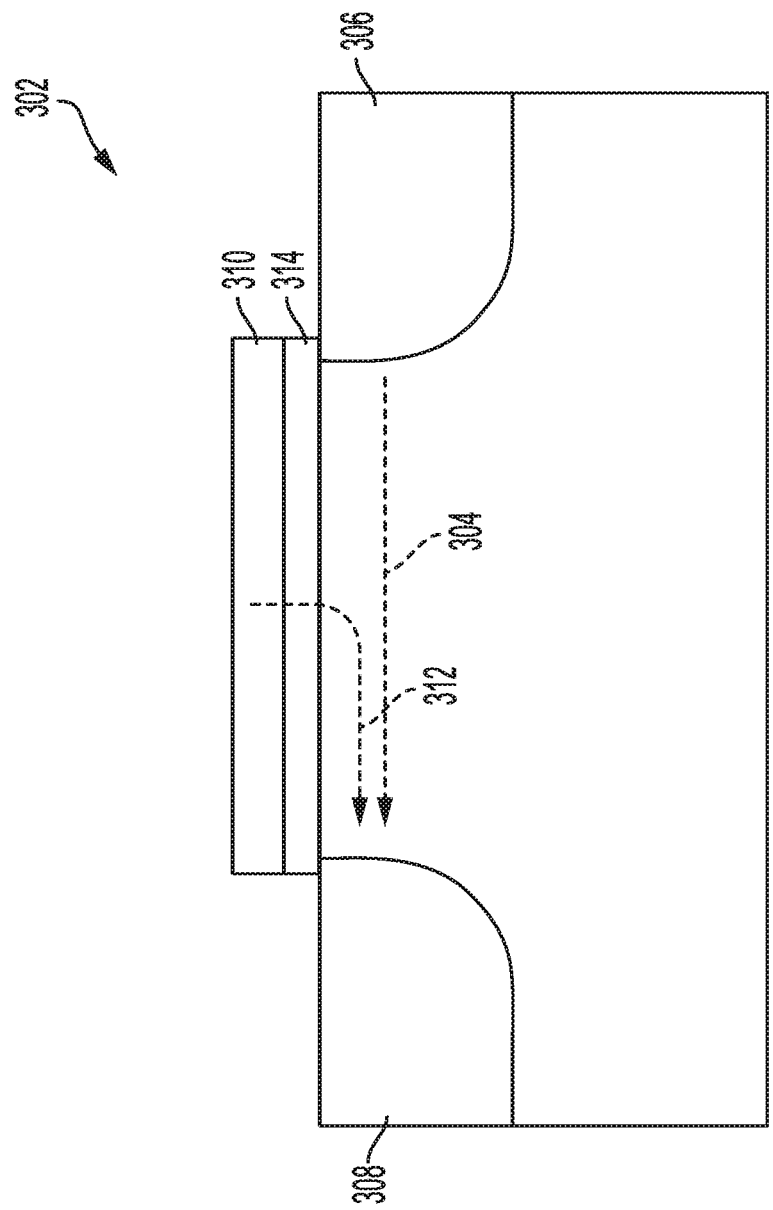

SENSOR FOR GATE LEAKAGE DETECTION

CROSS REFERENCES

The present Application for Patent claims priority to U.S. Provisional Patent Application No. 62/715,313 by Park et al., entitled "Sensor For Gate Leakage Detection," filed Aug. 7, 2018. The content of the provisional application is hereby incorporated by reference in its entirety.

BACKGROUND

I. Field of the Disclosure

Aspects of the disclosure relate generally to sensing leakage current in an integrated circuit (IC), and in particular to sensing gate leakage current in an IC.

II. Background

As integrated circuits advance to smaller process nodes, transistor leakage current is becoming even more important. Leakage current consumes power, which can shorten operating times of battery operated devices, such as cell phones or other portable devices, between charges. Leakage current also generates heat, which can shorten the life of the IC.

There is a need for mechanisms and methods to identify sources and causes of leakage current so that leakage current can be mitigated.

SUMMARY OF THE DISCLOSURE

The following presents a simplified summary of one or more aspects to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The described aspects generally relate to a gate leakage detection apparatus that includes a gate pad coupled to a gate of a MOS transistor. A gate leakage detection circuit is coupled to the gate pad, wherein the gate leakage detection circuit is configured to estimate a gate leakage current and based on the estimated gate leakage current determining a quality of a gate fabrication process.

The MOS transistor can be part of a decoupling capacitor. In addition, the gate leakage detection apparatus can include a ring oscillator circuit with a decoupling capacitor. The gate leakage detection apparatus can have the gate pad coupled to a gate of a transistor of the decoupling capacitor. In one embodiment, the gate leakage detection apparatus is on-die. In another embodiment, the gate leakage detection apparatus is in a scribe line of a wafer. The gate leakage detection apparatus can also be used to determine a work-function of a gate of the transistor.

In another embodiment, a gate leakage detection apparatus includes a ring oscillator circuit and a decoupling capacitor coupled to the ring oscillator circuit, the decoupling capacitor includes a plurality of transistors. A leakage detection circuit is coupled to a gate pad that is coupled to a gate of one of the plurality of capacitors.

In one embodiment, the gate leakage detection apparatus is configured to measure an electrical parameter, for example, a voltage or a current, or other electrical parameter. A quality of a gate fabrication process can be estimated based on the electrical parameter.

In an embodiment, a method of detecting a gate leakage includes monitoring a node coupled to a gate of a transistor. Measuring an electrical parameter at the node and based on the electrical parameter, evaluating a quality of a gate fabrication process. In one embodiment, the electrical parameter is a voltage, in another embodiment, the electrical parameter is a current, or other electrical parameter. The transistor can be part of a decoupling capacitor circuit. In addition, the method can estimate a metal gate work-function.

Various aspect and features of the disclosure are described in further detail below.

BRIEF DESCRIPTION OF THE FIGURES

The accompanying drawings are presented to aid in the description and illustrations of embodiments and are not intended to be limitations thereof.

FIG. 3 illustrates some sources of leakage current in a transistor.

The drawings may not depict all components of a particular apparatus, structure, or method. Further, like reference numerals denote like features throughout the specification and figures.

DETAILED DESCRIPTION

Figure 1:
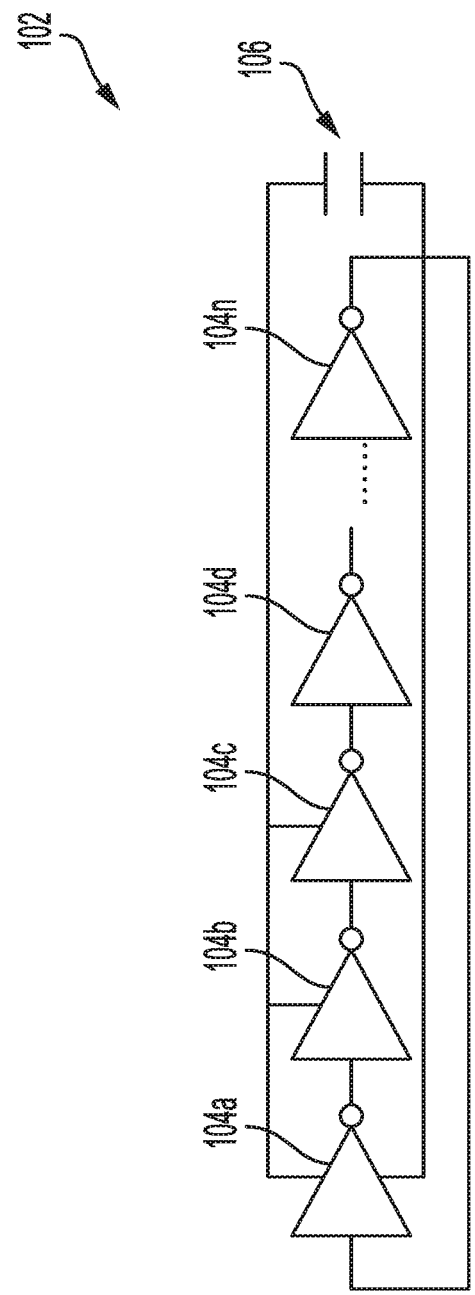
FIG. 1 is a diagram of an example ring oscillator.

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting During design of a ring oscillator circuit it was observed that there were higher leakage current levels than a previous design of a ring oscillator circuit. The two designs were compared, and the only difference was that the new ring oscillator design included decoupling capacitors and the previous ring oscillator design did not. Evaluation of the reasons for the different leakage current levels lead to aspects described below.

A technique of testing leakage current of a device, referred to as Iddq, measures the supply current (Idd) in a quiescent state (q). When a device is in a quiescent state there is no switching. In a quiescent state there is no current path between the power supply and ground, so any current measured is the leakage current of the device. As described below, two components of Iddq are the subthreshold leakage and the gate leakage. However, Iddq testing cannot identify what mechanism is the source of the leakage and what is the magnitude of the leakage contributed by any individual leakage source.

Leakage current can be affected by many different aspects. For example, subthreshold leakage increases as the threshold voltage (VT) of transistors decreases. But lower voltage threshold (VT) devices can switch faster which is desirable. Gate leakage current increases as the gate oxide thickness decreases as transistor sizes continue to decrease at advanced process nodes. Gate leakage can also increase if there is a defect during the manufacturing of the gate, for example if the gate oxide is damaged by over etching. It would be advantageous if the source and magnitude of each type of leakage current where known so as to help identify ways to mitigate them.

FIG. 1 is a diagram of an example ring oscillator 102. The ring oscillator 102 includes multiple inventors 104a-104n connected in series. Coupled to the ring oscillator 102 is a decoupling capacitor 106. As described below, aspects include a separate gate connection pad added to a gate of a transistor used to fabricate the decoupling capacitor, that enables a measurement of the gate leakage. A measurement of the gate leakage can be used to evaluate the fabrication process of the gate, such as the metal gate fabrication process. For example, a poor metal gate manufacturing process can result in a poor metal gate work-function tuning process and result in a high gate leakage current.

Figure 2B:
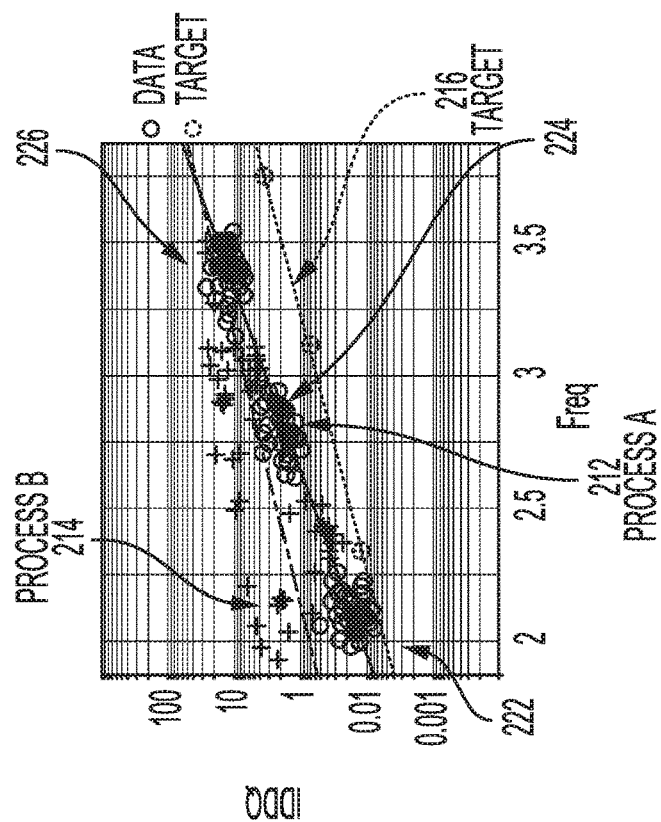
FIG. 2B is a plot of Iddq versus frequency for the ring oscillator design with decoupling capacitors.
Figure 2A:
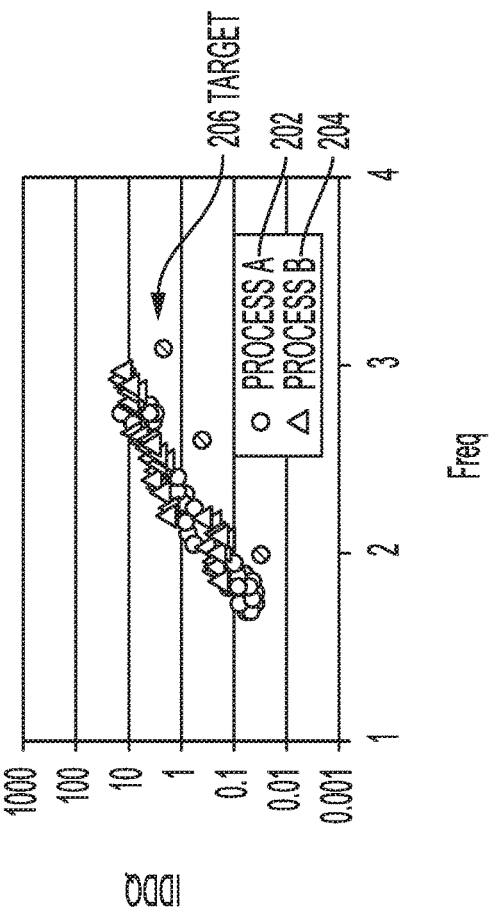
FIG. 2A is a plot of Did versus frequency for the ring oscillator design without decoupling capacitors.

FIG. 2A is a plot of Iddq versus frequency for the ring oscillator design without decoupling capacitors. FIG. 2A illustrates plots of two processes 202 and 204 and a target, or desired, process 206. The two processes are two different runs of the same process on the same machine, to see how large process variations are. As seen in FIG. 2A the two processes 202 and 204 overlay each other with small process variations.

FIG. 2B is a plot of Iddq versus frequency for the ring oscillator design with decoupling capacitors. FIG. 2B illustrates plots of two processes 212 and 214 and a target, or desired, process 216. Again, the two processes are two different runs of the same process on the same machine, to see how large process variations are. As seen in FIG. 2B, the two processes 212 and 214 do not overlay each other as closely as in FIG. 2A and illustrate relatively large process variations. In addition, the data of the two processes 212 and 214 are grouped into three clusters 222, 224, and 226. The first data cluster 222 corresponds to the leakage of transistors fabricated with a standard, or reference, VT (SVT). The second data cluster 224 corresponds to the leakage of transistors fabricated with a low VT (LVT). The third data cluster 226 corresponds to the leakage of transistors fabricated with an ultra-low VT (ULVT). As can be seen, the scatter of the data in general decreases as the threshold voltage (VT) decreases.

In the example illustrated in FIG. 2B, the decoupling capacitor is fabricated with a threshold voltage of SVT while the ring oscillator is fabricated using threshold voltages of SVT, LVT, and ULVT respectively corresponding to clusters 222, 224, and 226. In general, as the threshold voltage of the ring oscillator decreases the overall leakage increase, so the portion of the total leakage attributed to the decoupling capacitor is smaller in relation to the total leakage current. Thus the scattering of Iddq is larger at the SVT cluster 222 than the LVT and ULVT clusters 224 and 226. However, with just an Iddq measurement it is not possible to identify the source of the increased scatter illustrated in FIG. 2B compared to that illustrated in FIG. 2A.

FIG. 3 illustrates some sources of leakage current in a transistor. As shown in FIG. 3, in an MOS transistor 302 there can be leakage current, referred to as subthreshold leakage current 304, between a drain 306 and a source 308 of the transistor 302 even when the transistor 302 is in a static OFF state. For example, where a voltage on a gate of an NMOS transistor is below a threshold voltage (VT). The threshold voltage (VT) is the voltage level applied to the gate 310 of the transistor 302 to turn the transistor 302 ON. In general, as the threshold voltage (VT) of a transistor is reduced the subthreshold leakage current will increase.

Another leakage current, referred to as gate leakage 312 can flow through the gate 310 and a gate oxide 314 to the source 308. Gate leakage 312 occurs when there is a bias voltage applied to the gate 310 and electrons flow from the gate through the gate oxide 312 layer. As transistor scaling increases the thickness of gate oxide layers in transistors is decreasing which increases the gate leakage current. Also, gate leakage current can increase if there is damage to the gate during fabrication.

In addition to subthreshold and gate leakage, there are other sources of leakage, such as PN junction leakage, punch through leakage, etc., not illustrated.

Figure 4:
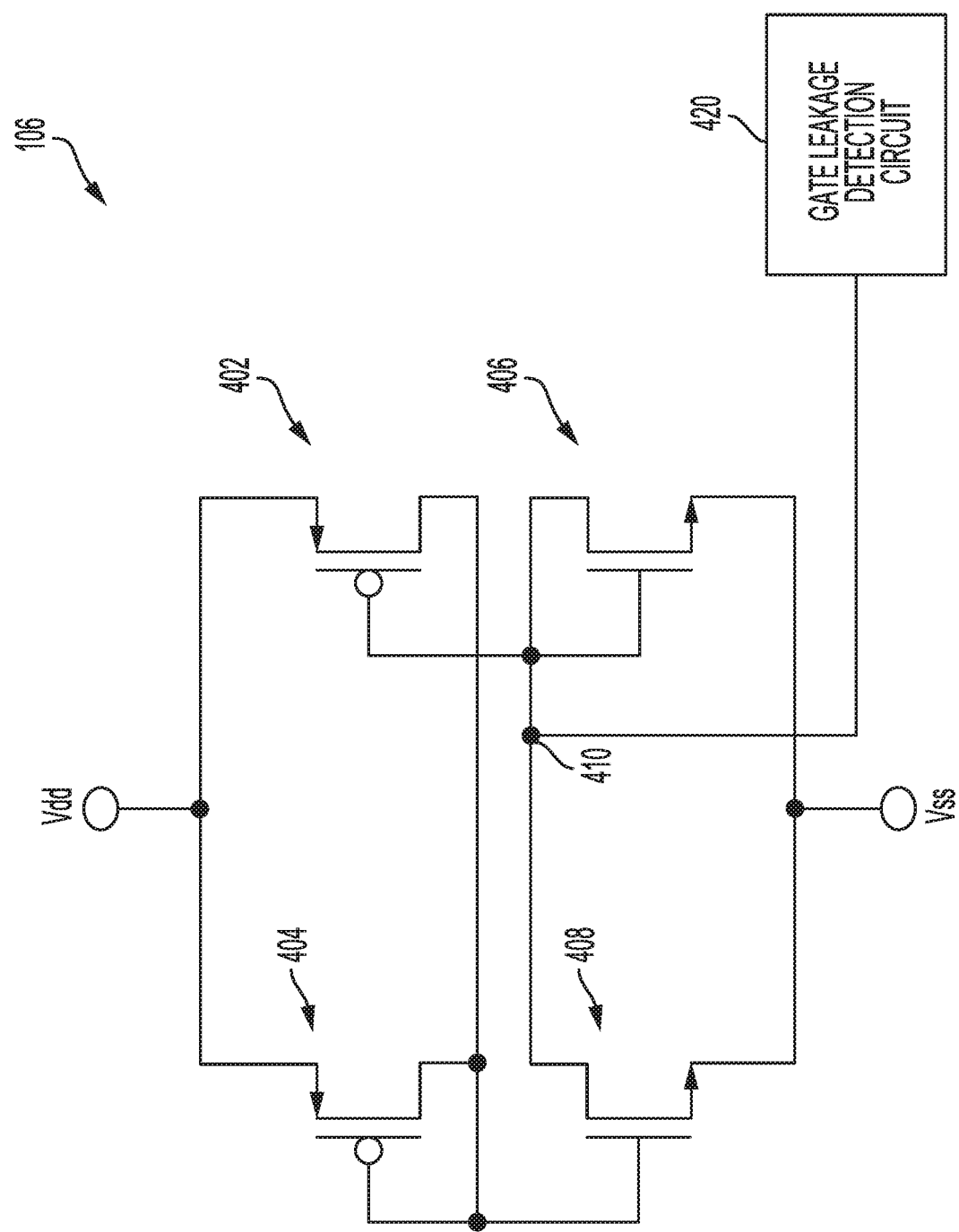
FIG. 4 is a diagram illustrating one embodiment of a decoupling capacitor.

FIG. 4 is a diagram illustrating one embodiment of the decoupling capacitor 106. As shown in FIG. 4, the decoupling capacitor 106 includes a first and second PMOS transistors 402 and 404, and a first and second NMOS transistors 406 and 408. The drains of the first and second PMOS transistors are coupled to a first voltage source Vdd and the sources are coupled to each other and to the gates of the second PMOS transistor 404 and second NMOS transistor 408. The sources of the first and second NMOS transistor 406 and 408 are coupled to a second voltage source Vss. The drains of the first and second NMOS transistor 406 and 408 are coupled to each other and to the gate of the first PMOS transistor 402 and first NMOS transistor 406. The four transistors are configured as a decoupling capacitor between Vdd and Vss. For example, Vdd can be a first potential and Vss a second lower potential, for example ground.

Coupled to the gate of the first NMOS transistor 406 is a gate pad 410 that is coupled to a gate leakage detection circuit 420. The gate leakage detection circuit 420 can measure an electrical parameter of the gate pad. For example, the electrical parameter can be the current flow into the gate pad 410, or the voltage level at the gate pad 410, or other electrical parameter that can be used to estimate a gate leakage. The gate leakage detection circuit 420 can also include any needed biasing circuitry to properly bias the transistor coupled to the gate pad 410.

The measurement of the gate leakage detection circuit 420 can be used to estimate a gate leakage current. In contrast to an Iddq measurement that measures overall leakage current, with the described aspects the gate leakage current can be decoupled from the subthreshold leakage, and other leakage current sources. The gate leakage current measurement can be used to evaluate the metal gate work-function process. As noted above, a poor metal gate process, such as over etch damage to the gate oxide, results in high gate leakage. Because the metal gate process in advanced CMOS technology is critical to adjust the threshold voltage of a transistor precisely without impacting any performance degradation, it is important to monitor the process function quality, or health.

In one embodiment, the transistors forming the decoupling capacitor 106 can be fabricated with a standard threshold voltage SVT. In another embodiment, the transistors forming the decoupling capacitor 106 can be fabricated with a threshold voltage that is the same as the threshold voltage as the transistors in the ring oscillator circuit.

In one embodiment, the ring oscillator with decoupling capacitors can be fabricated in a scribe line of a wafer. In this embodiment, the gate leakage detection circuit 420 can be external to the wafer, for example, using a probe of external test equipment to couple to the gate pad 410. In another embodiment, the decoupling capacitors and the gate leakage detection circuit can be fabricated in a scribe line of a wafer. In still another embodiment, the decoupling capacitors and the gate leakage detection circuit can be fabricated on a die of a wafer. In one embodiment, the on-die gate detection circuit can include a multiplexer and there can be multiple gate pads throughout the die to monitor gate leakage at different points on the die, and over time as the die is used in operation to detect if there is a change in gate leakage.

Figure 5:
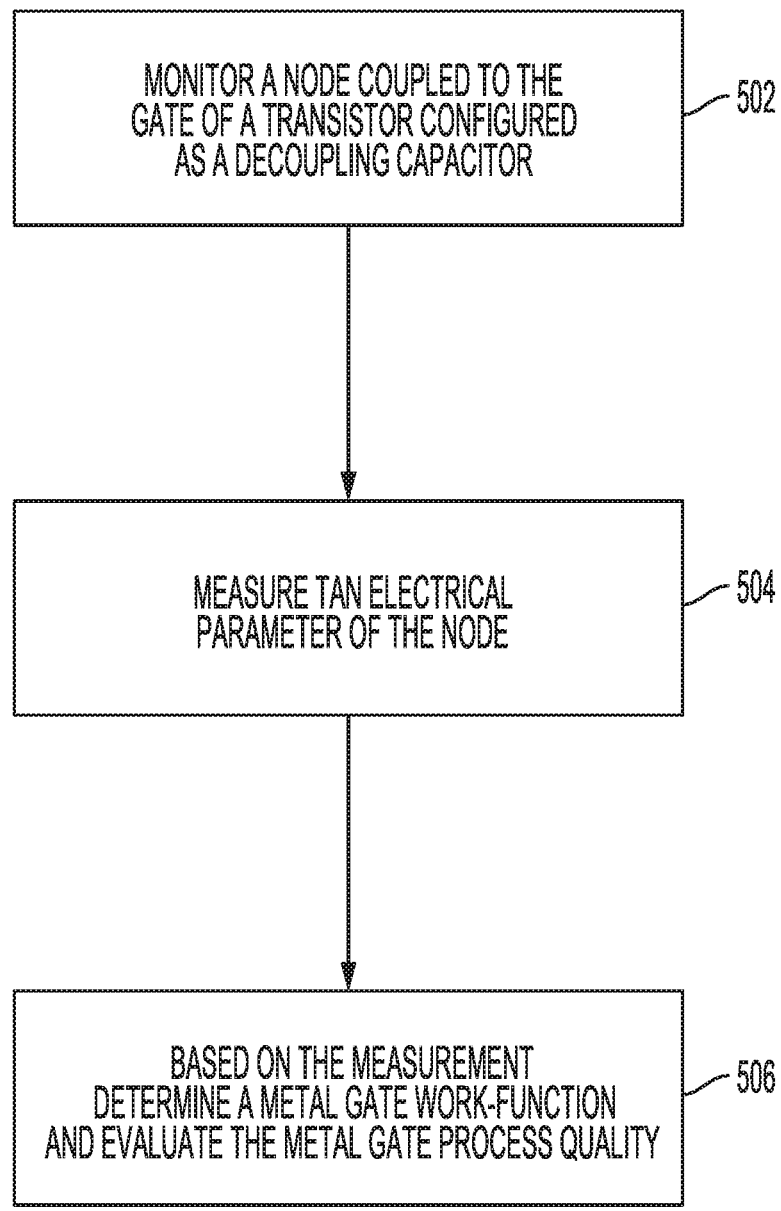
FIG. 5 is a flow diagram for evaluating a quality of a metal gate process.

FIG. 5 is a flow diagram for evaluating a quality of a metal gate process. Flow begins in block 502 where a node coupled to the gate of a transistor configured as a decoupling capacitor is monitored. Flow continues to block 504 where an electrical parameter at the gate pad is measured, such as the voltage and or current, or other electrical parameter, of the node is measured. Flow continues to block 506 where based on the measurement, a metal gate work-function is determined, and the metal gate process quality is evaluated.

While the above described aspects using a ring oscillator with decoupling capacitors to measure gate leakage current other types of circuits can be used for the detection of gate leakage. For example, a decoupling capacitor can be coupled between Vdd and Vss for any circuit, or a decoupling capacitor can be coupled between Vdd and Vss without being coupled to any circuit. Coupling a gate node to a gate of the decoupling capacitor can be used to measure gate leakage current using techniques described to detect the process health of the metal gate process.

While the above description gave some specific examples variations to the examples described can also be implemented. For example, a gate node can be coupled to any transistor in an IC where it is desired to measure the gate leakage current.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A gate leakage detection apparatus comprising:
   a ring oscillator circuit with a decoupling capacitor comprising a MOS transistor, the MOS transistor comprising a gate;
   a gate pad coupled to the gate of the MOS transistor; and
   a gate leakage detection circuit coupled to the gate pad, wherein the gate leakage detection circuit is configured to estimate a gate leakage current and based on the estimated gate leakage current determine a quality of a gate fabrication process.

2. The gate leakage detection apparatus of claim 1, wherein the gate leakage detection apparatus is on-die.

3. The gate leakage detection apparatus of claim 1, wherein the gate leakage detection apparatus is on a scribe line of a wafer.

4. The gate leakage detection apparatus of claim 1, wherein the gate leakage detection circuit is further configured to determine a work-function of the gate of the MOS transistor.

5. A gate leakage detection apparatus comprising:
   a ring oscillator circuit;
   a decoupling capacitor coupled to the ring oscillator circuit, the decoupling capacitor comprising a plurality of transistors;
   a gate pad coupled to a gate of one of the plurality of transistors; and
   a leakage detection circuit coupled to the gate pad.

6. The gate leakage detection apparatus of claim 5, wherein the leakage detection circuit is configured to measure an electrical parameter.

7. The gate leakage detection apparatus of claim 6, wherein a quality of a gate fabrication process is estimated based on the electrical parameter.

8. The gate leakage detection apparatus of claim 6, wherein the electrical parameter is a voltage.

9. The gate leakage detection apparatus of claim 6, wherein the electrical parameter is a current.

\* \* \* \* \*